(12) United States Patent
Ning

(10) Patent No.: US 11,869,573 B2
(45) Date of Patent: Jan. 9, 2024

(54) SEMICONDUCTOR MEMORY

(71) Applicant: Changxin Memory Technologies, Inc., Anhui (CN)

(72) Inventor: Shuliang Ning, Hefei (CN)

(73) Assignee: Changxin Memory Technologies, Inc., Hefei (CN)

(*) Notice: Subject to any disclaimer, the term of this patent is extended or adjusted under 35 U.S.C. 154(b) by 220 days.

(21) Appl. No.: 17/396,689

(22) Filed: Aug. 7, 2021

(65) Prior Publication Data
US 2021/0366532 A1    Nov. 25, 2021

Related U.S. Application Data

(63) Continuation of application No. PCT/CN2020/128959, filed on Nov. 16, 2020.

(30) Foreign Application Priority Data

Mar. 31, 2020 (CN) .......................... 202010243119.7

(51) Int. Cl.
  *G11C 11/40* (2006.01)
  *G11C 11/4074* (2006.01)
  (Continued)

(52) U.S. Cl.
  CPC ...... *G11C 11/4074* (2013.01); *G11C 11/4085* (2013.01); *H01L 24/08* (2013.01);
  (Continued)

(58) Field of Classification Search
  None
  See application file for complete search history.

(56) References Cited

U.S. PATENT DOCUMENTS

| 6,377,508 B1* | 4/2002 | Tomishima | ........... G11C 11/407 |
| | | | 365/189.11 |
| 6,385,119 B2* | 5/2002 | Kobayashi | .............. G05F 3/242 |
| | | | 713/300 |

(Continued)

FOREIGN PATENT DOCUMENTS

| CN | 103814628 A | 5/2014 |
| CN | 104102261 A | 10/2014 |

(Continued)

OTHER PUBLICATIONS

PCT International Search Report and the Written Opinion dated Feb. 23, 2021, issued in related International Application No. PCT/CN2020/128959 (8 pages).

(Continued)

*Primary Examiner* — Tan T. Nguyen
(74) *Attorney, Agent, or Firm* — Sheppard Mullin Richter & Hampton LLP

(57) ABSTRACT

A semiconductor memory is provided. The semiconductor memory comprises a memory chip and a voltage regulation unit. The memory chip includes at least a storage array and the voltage regulation unit includes at least an operational amplifier. The voltage regulation unit is configured to convert an external input first voltage into a second voltage to be provided to a word line driver circuit associated with the memory chip. The first voltage is greater than the second voltage. According to the semiconductor memory provided, power consumption of the memory chip (or the semiconductor memory) is reduced and the second voltage provided to the word line driver circuit reaches a threshold voltage.

19 Claims, 5 Drawing Sheets

(51) Int. Cl.
  *G11C 11/408* (2006.01)
  *H01L 23/00* (2006.01)
  *H01L 25/065* (2023.01)
  *H01L 25/18* (2023.01)
(52) U.S. Cl.
  CPC ...... *H01L 25/0652* (2013.01); *H01L 25/0657* (2013.01); *H01L 25/18* (2013.01); *H01L 2224/08146* (2013.01); *H01L 2225/0651* (2013.01); *H01L 2225/06541* (2013.01); *H01L 2924/1427* (2013.01); *H01L 2924/1436* (2013.01)

(56) References Cited

U.S. PATENT DOCUMENTS

| | | | | |
|---|---|---|---|---|
| 7,298,157 B2* | 11/2007 | Kim | ...................... | G11C 29/12 365/189.11 |
| 8,902,678 B2* | 12/2014 | Dimartino | ............... | G05F 1/575 365/230.06 |
| 8,913,443 B2 | 12/2014 | Pyeon | | |
| 2002/0027810 A1* | 3/2002 | Iida | ...................... | G11C 7/10 365/189.11 |
| 2004/0022115 A1* | 2/2004 | Park | ...................... | G11C 29/12 365/201 |
| 2004/0090826 A1* | 5/2004 | Ogiwara | ................. | G11C 11/22 365/189.07 |
| 2005/0232013 A1* | 10/2005 | Kawai | ................... | G11C 16/30 365/185.18 |
| 2005/0232042 A1* | 10/2005 | Kim | ................... | G11C 11/4094 365/203 |
| 2006/0273771 A1 | 12/2006 | Ettinger et al. | | |
| 2007/0035985 A1 | 2/2007 | Fifield et al. | | |
| 2007/0217269 A1* | 9/2007 | Fujita | ................... | G11C 11/4091 365/185.26 |
| 2008/0043510 A1* | 2/2008 | Tomita | .............. | G11C 11/4074 365/96 |
| 2008/0291750 A1* | 11/2008 | Takahashi | .............. | G11C 5/145 365/189.09 |
| 2009/0141538 A1* | 6/2009 | Fifield | ..................... | G11C 8/08 365/226 |
| 2010/0128551 A1* | 5/2010 | Tanzawa | ................. | G05F 1/575 365/226 |
| 2010/0172191 A1* | 7/2010 | Chen | ..................... | G11C 8/08 365/189.011 |
| 2010/0319026 A1* | 12/2010 | Ellis | ................... | H04N 21/2747 725/40 |
| 2011/0286291 A1 | 11/2011 | Yabuuchi et al. | | |
| 2012/0242312 A1 | 9/2012 | Heng | | |
| 2013/0070540 A1 | 3/2013 | Pyeon | | |
| 2015/0269970 A1* | 9/2015 | Zhang | ................ | G11C 13/0023 365/51 |
| 2016/0172019 A1* | 6/2016 | Gogl | ................... | G11C 11/1697 365/158 |
| 2017/0148503 A1* | 5/2017 | Hsu | ...................... | G11C 11/4074 |
| 2018/0261275 A1* | 9/2018 | Takizawa | ................. | G11C 8/14 |
| 2019/0164596 A1* | 5/2019 | Lee | ........................ | G11C 5/147 |
| 2022/0068400 A1* | 3/2022 | Pasotti | .................... | G11C 7/04 |

FOREIGN PATENT DOCUMENTS

| | | |
|---|---|---|
| CN | 105810247 A | 7/2016 |
| CN | 106782643 A | 5/2017 |
| CN | 109147834 A | 1/2019 |

OTHER PUBLICATIONS

PCT International Preliminary Report on Patentability dated Oct. 13, 2022, issued in related International Application No. PCT/CN2020/128959, with English translation (6 pages).

Extended European Search Report dated May 24, 2022, issued in related European Application No. 20920794.3 (9 pages).

Examination Report dated Jan. 30, 2023, issued in related European Application No. 20920794.3 (6 pages).

First Search dated May 18, 2023, issued in related Chinese Application No. 202010243119.7 (10 pages).

* cited by examiner

SEMICONDUCTOR MEMORY

CROSS-REFERENCE TO RELATED APPLICATIONS

This application is a continuation application of International Patent Application No.: PCT/CN2020/128959, filed on Nov. 16, 2020, which claims priority to Chinese Patent Application No.: 202010243119.7, filed on Mar. 31, 2020. The above-referenced applications are incorporated herein by reference in their entirety.

TECHNICAL FIELD

The present invention relates to memories for computing systems, and in particular, to semiconductor memories.

BACKGROUND

A dynamic random access memory (DRAM) is a semiconductor storage component commonly used in computing systems. The DRAM can comprise a storage array that includes many repeating storage units. Each storage unit usually includes a capacitor and a transistor. A gate of the transistor is connected or coupled to a word line of the DRAM, a drain of the transistor is connected or coupled to a bit line of the DRAM, and a source of the transistor is connected or coupled to the capacitor. A word line driver circuit of the DRAM can output a voltage signal onto the word line to turn ON or OFF the transistor. When the transistor is in an ON state, data (i.e., voltage) stored in the capacitor can be read through the bit line. Alternatively, in some cases, data (i.e., voltage) on the bit line can be written into the capacitor for storage.

Under conventional techniques, to increase write speed of the DRAM, an external input voltage to the word line driver circuit usually needs to be boosted. The boosting of the external input voltage can cause the DRAM to have large power consumption. In cases where the DRAM has a plurality of stacked layers, power consumption for the DRAM can worsen by boosting the external input voltage. As a result, power efficiency of the DRAM can be low. As such, voltage applied to the word line driver circuit may be less than a threshold voltage needed to operate the word line driver circuit.

SUMMARY

A technical problem to be solved by the present invention includes reducing power consumption of a semiconductor memory, improving power efficiency of the semiconductor memory, and avoiding cases when voltage applied to a word line driver circuit of the semiconductor memory is less than a threshold voltage needed to operate the word line driver circuit.

Therefore, the present invention provides a semiconductor memory comprising a memory chip and a voltage regulation unit. The memory chip can include at least a storage array and the voltage regulation unit can be configured to convert an external input first voltage into a second voltage to be provided to a word line driver circuit associated with the semiconductor memory. In some embodiments, the external input first voltage Vext can be greater than the second voltage. In other embodiments, the second voltage can be greater than the external input first voltage Vext. Many variations are possible.

In some embodiments, the semiconductor memory can include at least two memory chips. In such embodiments, the at least two memory chips are sequentially stacked in a vertical direction. In some cases, the at least two memory chips can be arranged horizontally in a plane arrangement.

In some embodiments, the voltage regulation unit can be configured to output the second voltage to a word line driver circuit of the memory chip. In some embodiments, the voltage regulation unit can output the second voltage to word line driver circuits of the at least two memory chips.

In some embodiments, the semiconductor memory can include at least two voltage regulation units. In such embodiments, each voltage regulation unit can output the second voltage to a word line driver circuit in a corresponding memory chip within which the voltage regulation unit resides.

In some embodiments, the semiconductor memory can include at least two voltage regulation units integrated into a single memory chip. In such embodiments, the at least two voltage regulation units can output the second voltage to a word line driver circuit of the memory chip.

In some embodiments, the semiconductor memory can include one memory chip and one voltage regulation unit. In such embodiments, the voltage regulation unit is integrated into the memory chip.

In some embodiments, the semiconductor memory can include at least two memory chips and one voltage regulation unit. In such embodiments, the one voltage regulation unit is integrated into one of the at least two memory chips.

In some embodiments, the voltage regulation unit can be an independent voltage regulation chip. In such embodiments, the semiconductor memory can further include a line substrate. The line substrate can have a connection line. The memory chip and the voltage regulation chip can be disposed on the line substrate. In such embodiments, the voltage regulation chip can be connected or coupled to the memory chip through the connection line and the second voltage outputted by the voltage regulation chip is applied to the word line driver circuit of the memory chip through the connection line of the line substrate.

In some embodiments, the memory chip can be a dynamic random access memory (DRAM) chip.

In some embodiments, the external input first voltage can range from 3 V to 4 V and the second voltage can range from 2.5 V to 2.9 V.

In some embodiments, the voltage regulation unit can comprise an operational amplifier, a first resistor, and a second resistor. One end of the first resistor can be connected or coupled to the external input first voltage and the other end of the first resistor can be connected to one end of the second resistor. The other end of the second resistor can be connected or coupled to a ground. An electrical connection point formed between the first resistor and the second resistor can be connected or coupled to a positive input end of the operational amplifier. A negative input end of the operational amplifier can be connected or coupled to an output end of the operational amplifier. The operational amplifier can be configured to output the second voltage. A supply end of the operational amplifier can be connected or coupled to the external input first voltage.

In some embodiments, a ratio of the resistance of the first resistor to the resistance of the second resistor can range from 3/2.9 to 4/2.5.

In some embodiments, the voltage regulation unit can include an operational amplifier, a first resistor, a second resistor, and a p-channel metal oxide semiconductor (PMOS) transistor. One end of the first resistor can be connected or coupled to one end of the second resistor and the other end of the first resistor can be connected or coupled to a drain of the PMOS transistor. The other end of the second resistor can be connected or coupled to a ground. A positive input end of the operational amplifier can be connected or coupled to an electrical connection point formed between the first resistor and the second resistor. A negative input end of the operational amplifier can be connected or coupled to a reference voltage. An output end of the operational amplifier can be connected or coupled to a gate of the PMOS transistor. A supply end of the operational amplifier can be connected or coupled to the external input first voltage. A source of the PMOS transistor can be connected or coupled to the external input first voltage. An electrical connection point formed between the drain of the PMOS transistor and the first resistor can output the second voltage.

In some embodiments, the voltage regulation unit can further include a capacitor. One end of the capacitor can be connected or coupled to the electrical connection point formed between the drain of the PMOS transistor and the first resistor, and the other end of the capacitor can be connected or coupled to a ground. The capacitance of the capacitor can range from 5 pF to 30 pF. A bias current of the operational amplifier can be fixed and can range from 5 µA to 50 µA.

In some embodiments, the voltage regulation unit can include an operational amplifier, a first resistor, a second resistor, and a PMOS transistor. One end of the first resistor can be connected or coupled to one end of the second resistor and the other end of the first resistor can be connected or coupled to a drain of the PMOS transistor. The other end of the second resistor can be connected or coupled to a ground. A positive input end of the operational amplifier can be connected or coupled to an electrical connection point formed between the first resistor and the second resistor. A negative input end of the operational amplifier can be connected or coupled to a reference voltage. An output end of the operational amplifier can be connected or coupled to a gate of the PMOS transistor. A supply end of the operational amplifier can be connected or coupled to the external input first voltage. An enable end of the operational amplifier can be connected or coupled to an enable signal. A source of the PMOS transistor can be connected or coupled to the external input first voltage. An electrical connection point formed between the drain of the PMOS transistor and the first resistor can output the second voltage.

In some embodiments, the voltage regulation unit can further include a capacitor. One end of the capacitor can be connected or coupled to the electrical connection point formed between the drain of the PMOS transistor and the first resistor and the other end of the capacitor can be connected or coupled to a ground. The capacitance of the capacitor can range from 5 pF to 30 pF. The operational amplifier can be controlled to operate in an operating mode or sleep mode through the enable signal. A bias current of the operational amplifier in the operating mode can range from 10 µA to 100 µA. A bias current of the operational amplifier in the sleep mode can range from 0.5 µA to 3 µA.

In some embodiments, the voltage regulation unit can include an operational amplifier, a first resistor, a second resistor, a PMOS transistor, and a mirror current source. One end of the first resistor can be connected or coupled to one end of the second resistor and the other end of the first resistor can be connected or coupled to a drain of the PMOS transistor. The other end of the second resistor can be connected or coupled to a ground. A positive input end of the operational amplifier can be connected or coupled to an electrical connection point formed between the first resistor and the second resistor. A negative input end of the operational amplifier can be connected or coupled to a reference voltage. An output end of the operational amplifier can be connected or coupled to a gate of the PMOS transistor. A supply end of the operational amplifier can be connected or coupled to the external input first voltage. A first input end of the image current source can be connected or coupled to the external input first voltage. A second input end of the mirror current source can be connected or coupled to the output end of the operational amplifier. An output end of the mirror current source can generate an output current to regulate a bias current of the operational amplifier. A source of the PMOS transistor can be connected or coupled to the external input first voltage. An electrical connection point formed between the drain of the PMOS transistor and the first resistor outputs the second voltage.

In some embodiments, the voltage regulation unit can further include a capacitor. One end of the capacitor can be connected or coupled to the electrical connection point formed between the drain of the PMOS transistor and the first resistor. The other end of the capacitor can be connected or coupled to a ground. The capacitance of the capacitor can range from 5 pF to 30 pF. A ratio of the output current of the mirror current source to a current through the PMOS transistor can range from 1:1000 to 1:100.

In some embodiments, the voltage regulation unit can include an operational amplifier, a first resistor, a second resistor, a first PMOS transistor, and a second PMOS transistor. One end of the first resistor can be connected or coupled to one end of the second resistor and the other end of the first resistor can be connected or coupled to a drain of the first PMOS transistor. The other end of the second resistor can be connected or coupled to a ground. A positive input end of the operational amplifier can be connected or coupled to an electrical connection point formed between the first resistor and the second resistor. A negative input end of the operational amplifier can be connected or coupled to a reference voltage. An output end of the operational amplifier can be connected or coupled to a gate of the first PMOS transistor. A supply end of the operational amplifier can be connected or coupled to the external input first voltage. A source of the first PMOS transistor can be connected or coupled to the external input first voltage and an electrical connection point formed between the drain of the first PMOS transistor and the first resistor outputs the second voltage. A source of the second PMOS transistor can be connected or coupled to the external input first voltage. A gate of the second PMOS transistor can be connected or coupled to the output end of the operational amplifier. A drain of the second PMOS transistor can be connected or coupled to a bias current regulation end of the operational amplifier to regulate a bias current of the operational amplifier.

In some embodiments, the voltage regulation unit can further include a capacitor. One end of the capacitor can be connected or coupled to the electrical connection point between the drain of the first transistor and the first resistor. The other end of the capacitor can be connected or coupled to a ground. The capacitance of the capacitor can range from 5 pF to 30 pF.

Comparing with conventional technologies, solutions of the present invention have the following advantages:

A semiconductor memory in the present invention includes a memory chip and a voltage regulation unit. The memory chip includes at least a storage array. The voltage regulation unit is configured to convert an external input first voltage into a second voltage to be provided to a word line driver circuit associated with the memory chip. In some cases, the external input first voltage is greater than the second voltage. In other cases, the second voltage is greater than the external input first voltage. To be specific, in this application, a voltage supplied to the word line driver circuit associated with the memory chip is the second voltage after the voltage regulation unit converts the external input first voltage. As such, power needed for the memory chip to perform data-read and/or data-write operations can be reduced. In addition, power dissipation through various metal connection lines, conductive structures, and parasitic resistances and capacitances can also be reduced.

Further, when the semiconductor memory includes at least two memory chips, each memory chip can have its own voltage regulation units. In this way, each voltage regulation unit bears a smaller power burden and voltage drop caused by various conductive paths can be avoided.

DETAILED DESCRIPTION OF THE EMBODIMENTS

Figure 1:
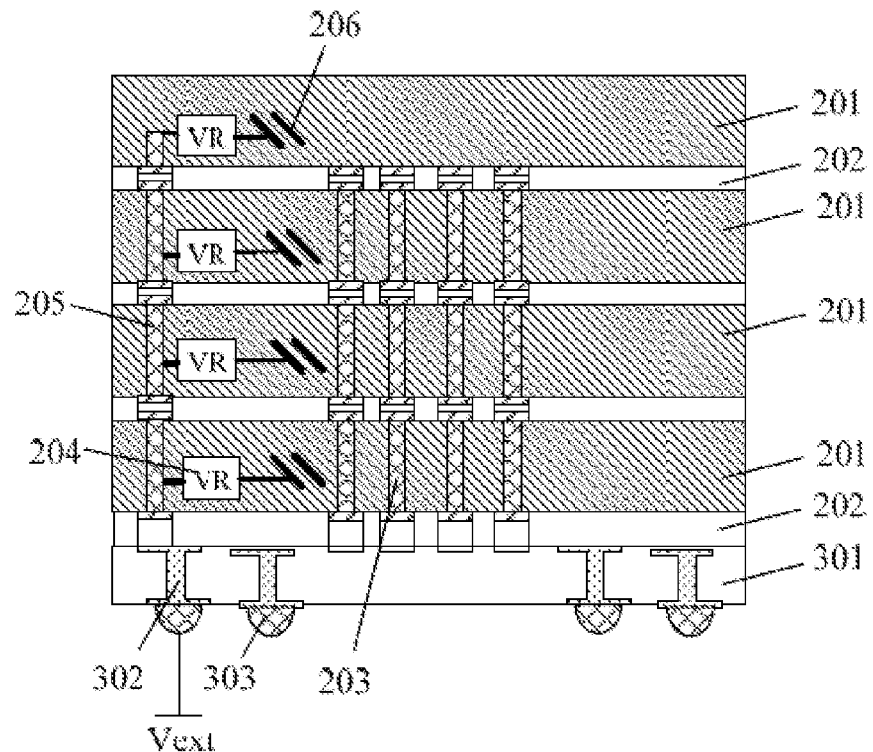
FIGS. 1, 2, 3, and 4 are schematic structural diagrams illustrating a semiconductor memory according to an embodiment of the present invention.

As described above, under conventional techniques, to increase write speed of a semiconductor memory (e.g., a dynamic random access memory or DRAM), an external input voltage to a word line drive circuit of the semiconductor memory usually needs to be boosted prior to providing the external input voltage to the word line driver circuit. The boosting of the external input voltage can cause power consumption of the semiconductor memory to increase. In cases where the semiconductor memory has a plurality of stacked layers, the power consumption can worsen. In addition, a voltage outputted by the word line driver circuit may be less than a threshold voltage value needed to operate the semiconductor memory.

Under conventional techniques, a charge pump circuit is used to boost the external input voltage. For example, a charge pump circuit can be configured to boost a voltage from 2.5 V to 2.9 V. The boosted voltage outputted by the charge pump circuit is then provided to the word line driver circuit. The word line driver circuit can then provide the boosted voltage to a word line of the semiconductor memory to cause data-read or data-write operations. In general, voltage conversion efficiency of a charge pump circuit is low. As such, power needed to operate the charge pump circuit, correspondingly, is large, which further worsens the power consumption of the semiconductor memory. Furthermore, because the charge pump circuit is complex, it can occupy a large chip area which, in turn, causes a die size of the semiconductor memory to increase.

In some cases, to improve a storage capacity of a semiconductor memory, a plurality of layers comprising memory chips can be stacked and packaged in a direction (e.g., a vertical direction). For example, high capacity memories such as hybrid memory cubes (HMC) and/or high bandwidth memory (HBM) can have layers of memory chips that are stacked and packaged either vertically or horizontally. In such cases, power consumption is further increased due to the plurality of layers. As a general rule, the more layers or memory chips a semiconductor memory has, the larger the power consumption for the semiconductor memory. In some cases, as layers of a semiconductor memory increase, supply current needed to operate charge pump circuits in each layer of the semiconductor memory, correspondingly, increases. In such cases, the increase in the supply current further causes power consumption to increase. Finally, parasitic resistances and capacitances associated with metal connection lines of the semiconductor memory (e.g., write lines, bit lines, gates of transistors, etc.) can further cause power consumption to increase.

The disclosure provided herein addresses the problems described above. In various embodiments, the present invention provides a semiconductor memory comprising a memory chip and a voltage regulation unit. The memory chip can include at least a storage array and the voltage regulation unit can be configured to convert an external input first voltage into a second voltage to be provided to a word line driver circuit associated with the memory chip. In some embodiments, the external input first voltage can be greater than the second voltage. In other embodiments, the second voltage can be greater than the external input first voltage. Many variations are possible. To be specific, in this application, a voltage provided to the word line driver circuit associated with the memory chip is the second voltage outputted by the voltage regulation unit after the voltage regulation unit converts the external input first voltage into the second voltage. Therefore, a voltage supplied to the memory chip can be smaller (or higher) than a voltage provided to the word line driver circuit associated with the memory chip. As such, power consumption associated with various metal connection lines and/or conductive structures of the memory chip can be reduced, resulting in lower power consumption for the memory chip. Furthermore, because the power consumption due to parasitics is low, a voltage provided to the word line driver circuit can reach a threshold voltage value.

To make the foregoing objectives, features, and advantages of the present invention clearer and easier to understand, the following describes various embodiments of the present invention in detail with reference to drawings. The drawings are merely provided as examples and should not be construed as limitations to the subject matter claimed in the present invention.

Figure 2:
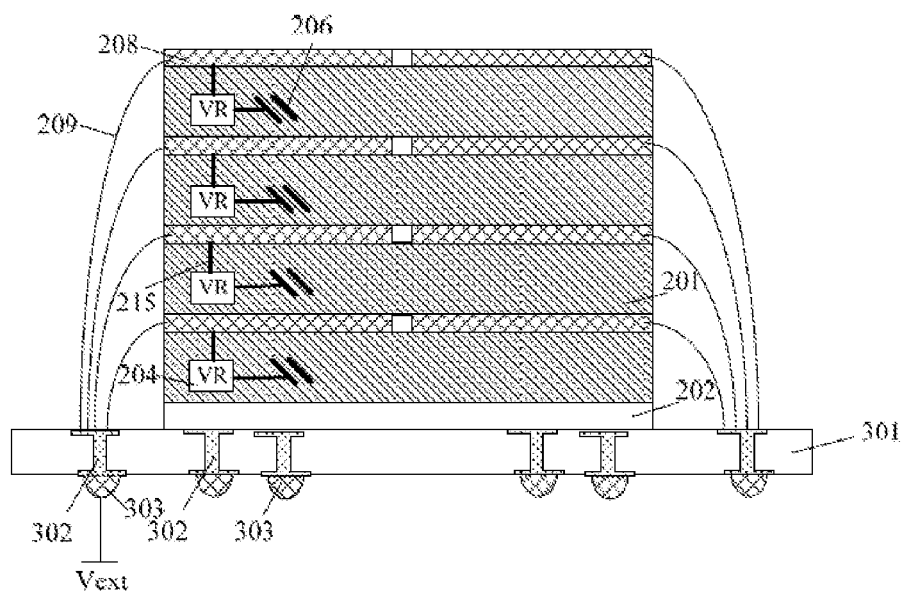

FIGS. 1 and 2 are schematic structural diagrams illustrating a semiconductor memory according to an embodiment of the present invention. As shown in FIG. 1, in some embodiments, the semiconductor memory can include a memory chip 201 and a voltage regulation unit 204. The memory chip 201 can include at least a storage array (not shown in FIGS. 1 and 2) and the voltage regulation unit 204 can be configured to convert an external input first voltage Vext into a second voltage to be provided to a word line driver circuit 206 associated with the memory chip 201. In some embodiments, the external input first voltage Vext can be greater than the second voltage. In other embodiments, the second voltage can be greater than the external input first voltage Vext. Many variations are possible.

In some embodiments, the memory chip 201 can be a memory used in computing systems. The memory chip 201 can be configured to perform various data operations. For example, the memory chip 201 can be configured to perform data-write, data-read, or data-erase operations on the storage array of the memory chip 201. In various embodiments, the memory chip 201 can be fabricated through a semiconductor integration manufacturing process. In some embodiments, the storage array of the memory chip 201 can include a plurality of storage units with each storage unit comprising a transistor connected or coupled to a capacitor at a first terminal of the transistor (e.g., a source of the transistor). The capacitor can be configured to store various data values (e.g., binary values of 0 or 1). In some embodiments, the storage array of the memory chip 201 can further include bit lines and word lines. The bit lines are connected or coupled to second terminals of transistors (e.g., drains of the transistors) of the plurality of storage units and the word lines are connected or coupled to third terminals of the transistors (e.g., gates of the transistors) of the plurality of storage units. In some embodiments, the word line driver circuit associated with the memory chip 201 can be configured to output a voltage (e.g., a voltage signal) to a word line to turn ON/OFF transistors associated with the word line. In this way, data-write or data-read operations can be performed on storage units associated with the word line. In some embodiments, the memory chip 201 can further include a peripheral circuit connected or coupled to the storage array. The peripheral circuit can generate signals (e.g., operational amplifier enable signals) to configure the voltage regulation unit 204 to operate in various modes. In some embodiments, the memory chip 201 can be a DRAM chip. In general, the memory chip 201 any suitable type of memory chip.

As shown in FIG. 1, in some embodiments, the semiconductor memory can include a plurality of memory chips 201. In such embodiments, the plurality of memory chips 201 can be sequentially stacked in a vertical direction (e.g., upward or downward) to form a stacked structure of memory chips. For example, four memory chips 201 shown in FIG. 1 can be sequentially stacked vertically to form a stacked structure of memory chips. In some embodiments, when the semiconductor memory is configured in the stacked structure of memory chips, the plurality of memory chips 201 can be laminated through a bonding process. In such embodiments, through-silicon vias (TSVs) 203 and 205 can be formed in the semiconductor memory through the plurality of memory chips 201. Electrical connection points associated with the plurality of memory chips 201 can be led out through the TSVs 203 and 205.

In some embodiments, when the semiconductor memory comprises at least two memory chips 201, the at least two memory chips 201 can be arranged horizontally in a plane arrangement. For example, the two memory chips 201 can be adjacently disposed on a line substrate (e.g., a printed circuit board substrate) 301.

In some embodiments, when the semiconductor memory comprises at least two memory chips 201 in a stacked structure of memory chips, the two memory chips 201 can be bonded together through a bonding process. In various embodiments, the bonding process may be a metal bonding process, a direct bonding process, or another bonding process. Many variations are contemplated. During the bonding process, the two memory chips 201 can be isolated from each other by an isolating layer 202.

In some embodiments, the line substrate 301 may be formed on a backside of the stacked structure of memory chips or a backside of a memory chip 201. The line substrate (e.g., a line layer) 301 can be isolated from the backside of the stacked structure of memory chips by the isolating layer 202. In some embodiments, the line substrate 301 can include rewiring layers (e.g., metal line layers) 302 connected or coupled to the TSVs 203 and 205. In some embodiments, the line substrate 301 can further include solder balls 303 connected or coupled to the rewiring layers 302 through which the external input first voltage Vext is provided to the word line driver circuit 206. In some embodiments, as shown in FIG. 2, when the plurality of memory chips 201 of the semiconductor memory are stacked in a stacked structure, a connection pad 208 on each memory chip 201 can be connected or coupled to the rewiring layers 302 of the line substrate 301 through metal leads 209. In such embodiments, the metal leads 209 can be formed on the line substrate 301 during a lead bonding process.

Referring back to FIG. 1, as discussed above, in some embodiments, the voltage regulation unit 204 of the memory chip 201 can be configured to convert the external input first voltage Vext into the second voltage, and output the second voltage to the word line driver circuit 206. In this way, the word line driver circuit 206 can provide the second voltage to a word line to cause data-write and/or data-read operations. In such embodiments, the external input first voltage Vext is greater than the second voltage. To be specific, in this application, a voltage supplied to the word line driver circuit 206 the memory chip 201 is the second voltage outputted by the voltage regulation unit 204 to the word line driver circuit 206 after the voltage regulation unit 204 converts the external input first voltage into the second voltage. Therefore, a voltage supplied to the memory chip 201 can be smaller than a voltage provided to the word line driver circuit 206 associated with the memory chip 201 to perform data-write and data-read operations. As such, power consumption associated with various metal connection lines and/or conductive structures can be reduced, resulting in lower power consumption for the memory chip 201. Furthermore, because the power consumption associated with parasitics is low, a voltage provided to the word line driver circuit 206 can reach a threshold voltage needed to cause data-write and/or data-read operations.

In some embodiments, the semiconductor memory of FIGS. 1 and 2 can include at least one voltage regulation unit 204. In other embodiments, the semiconductor memory of FIGS. 1 and 2 can include at least two voltage regulation units 204. When the semiconductor memory includes at least two memory chips 201, there can be at least two corresponding voltage regulation units 204. In general, the number of voltage regulation units 204 in a semiconductor memory is equal to the number of memory chips 201 in the semiconductor memory. In such embodiments, each voltage regulation unit 204 can output the second voltage to a word line driver circuit 206 of a corresponding memory chip 201. For example, the semiconductor memory shown in FIG. 1 or FIG. 2 has four memory chips 201 and four corresponding voltage regulation units 204. In this example, each memory chip 201 is associated with a voltage regulation unit 204, and each voltage regulation unit 204 is integrated into a memory chip 201. As such, in such embodiments, the voltage regulation unit 204 can bear a smaller burden, voltage drop caused by conductive paths associated with the memory chip 201 can be avoided.

In some embodiments, as shown in FIG. 1, the external input first voltage Vext may be provided to the voltage regulation unit 204 through the solder balls 302 of the line substrate 301, the rewiring layers 302 of the line substrate 301, and the TSV 205 of the plurality of memory chips 201. In such embodiments, the voltage regulation unit 204 converts the external input first voltage Vext into the second voltage and outputs the second voltage to the word line driver circuit 206 through a metal connection line formed in the memory chip 201. In some embodiments, as shown in FIG. 2, the external input first voltage Vext may be provided to the voltage regulation unit 204 through the solder balls 302 of the line substrate 301, the rewiring layers 302 of the line substrate 301, the metal leads 209, the connection pads 208, and a first metal connection line 215 of the memory chip 201. In such embodiments, the voltage regulation unit 204 converts the external input first voltage Vext into the second voltage and outputs the second voltage to the word line driver circuit 206 through a second metal connection line formed in the memory chip 201.

Figure 3:
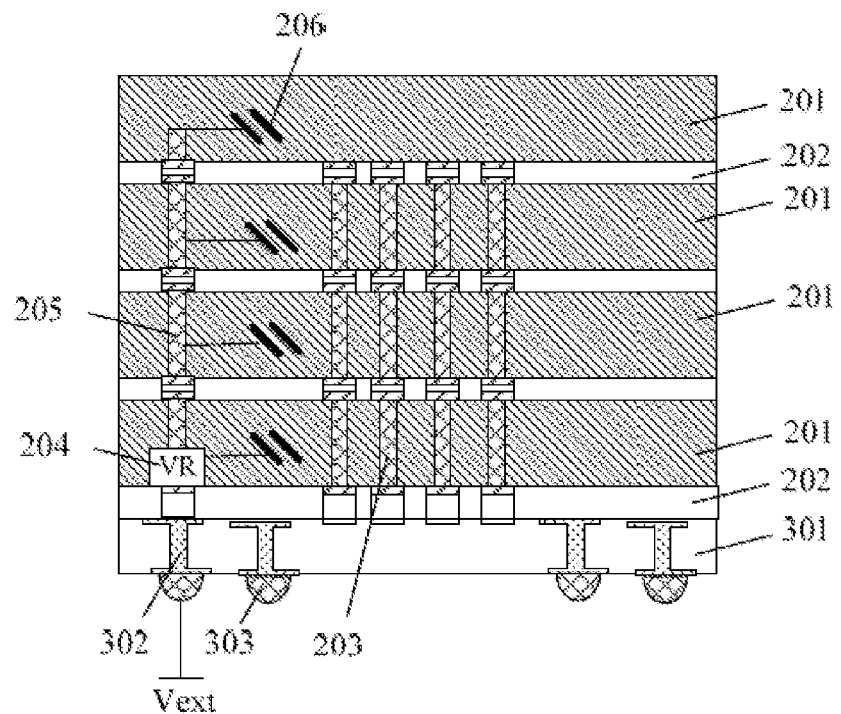

FIG. 3 is another schematic structural diagram illustrating the semiconductor memory according to an embodiment of the present invention. In some embodiments, as shown in FIG. 3, the semiconductor memory can include one voltage regulation unit 204. The voltage regulation unit 204 can be configured to output the second voltage to the word line driver circuit 206 associated with the memory chip 201. Alternatively, the voltage regulation unit 204 can simultaneously output the second voltage to word line driver circuits associated with other memory chips 201 of the semiconductor memory. In other words, the voltage regulation unit 204 may convert the external input first voltage Vext into the second voltage, then distribute the second voltage to the word line driver circuits associated with the memory chips 201. For example, the semiconductor memory shown in FIG. 3 includes four memory chips 201 and one voltage regulation unit 204. In this example, the voltage regulation unit 204 is integrated into one of the memory chips 201. Preferably, the voltage regulation unit 204 is integrated into the memory chip 201 disposed at the bottommost layer of the stacked structure of memory chips. In this example, the voltage regulation unit 204 receives the external input first voltage Vext and converts the external input first voltage into the second voltage, and outputs the second voltage to the word line driver circuits 206 in the four memory chips 201.

In some embodiments, the semiconductor memory can include at least two voltage regulation units 204 configured to simultaneously provide the second voltage to a word line driver circuit 206 associated with a memory chip 201. In such embodiments, the at least two voltage regulation units 204 can output the second voltage to the word line driver circuit 206 associated with the memory chip 201. In such embodiments, the at least two voltage regulation units 204 are integrated into the memory chip 201.

Figure 4:
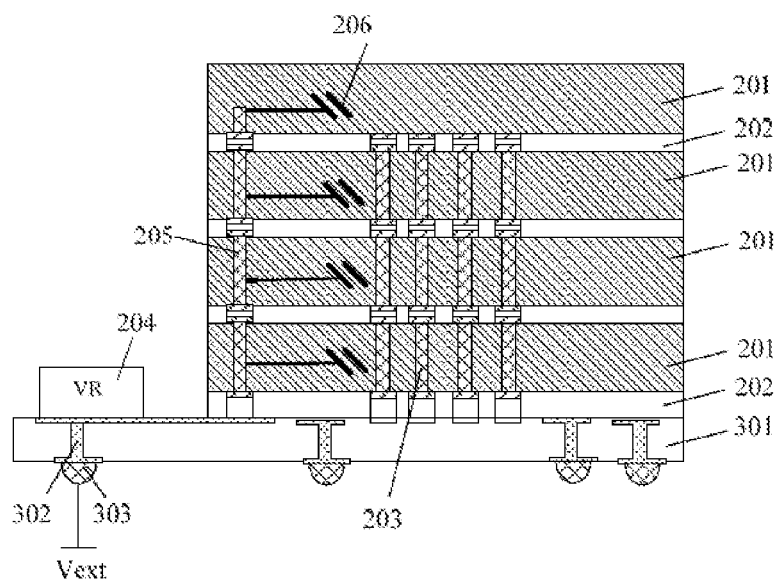

FIG. 4 is yet another schematic structural diagram illustrating the semiconductor memory according to an embodiment of the present invention. In some embodiments, as shown in FIG. 4, the semiconductor memory can include a voltage regulation unit 204 external to the plurality of memory chips 201. In such embodiments, the voltage regulation unit 204 may be an independent voltage regulation chip. For example, as shown in FIG. 4, the voltage regulation unit 204 (i.e., the independent voltage regulation chip) is disposed on the line substrate 301, and the voltage regulation unit 204 is connected to the plurality of memory chips 201 through a connection line on the line substrate 301. In this example, the external input first voltage Vext is provided to the voltage regulation unit 204 through the solder balls 303 and the rewiring layers 302. The voltage regulation unit 204 converts the external input first voltage Vext into the second voltage. The second voltage is then provided to the word line driver circuit 206 associated with the memory chip 201 through connection lines (e.g., a metal wiring layer) on the line substrate 301 and a connection structure (e.g., the TSV 205) of the memory chip 201. In some embodiments, the semiconductor memory can include more than one voltage regulation unit 204. When the semiconductor memory includes one voltage regulation unit 204, the voltage regulation unit 204 can transfer the second voltage to one memory chip 201. In some cases, the voltage regulation unit 204 can simultaneously transfer the second voltage to a plurality of memory chips 201. When the semiconductor memory includes a plurality of voltage regulation units 204 corresponding to the plurality of memory chips 201, each voltage regulation unit 204 may provide the second voltage to a corresponding word line driver circuit 206 associated with a memory chip 201. In some cases, the plurality of voltage regulation units 204 transfer the second voltage to a word line driver circuit 206 associated with a memory chip 201. Many variations are possible.

In some embodiments, the semiconductor memory chip can be a DRAM chip. In such embodiments, the external input first voltage Vext and range from 3 V to 4 V. In one implementation, the external input first voltage Vext can have a voltage that corresponds to at least one of 3 V, 3.1 V, 3.2 V, 3.3 V, 3.4 V, 3.5 V, 3.6 V, 3.7 V, 3.8 V, 3.9 V, or 4V. Likewise, in some embodiments, the second voltage can range from 2.5 V to 2.9 V. In one implementation, the second voltage can have a voltage that corresponds to at least one of 2.5 V, 2.6 V, 2.7 V, 2.8 V, or 2.9 V.

Figure 5:
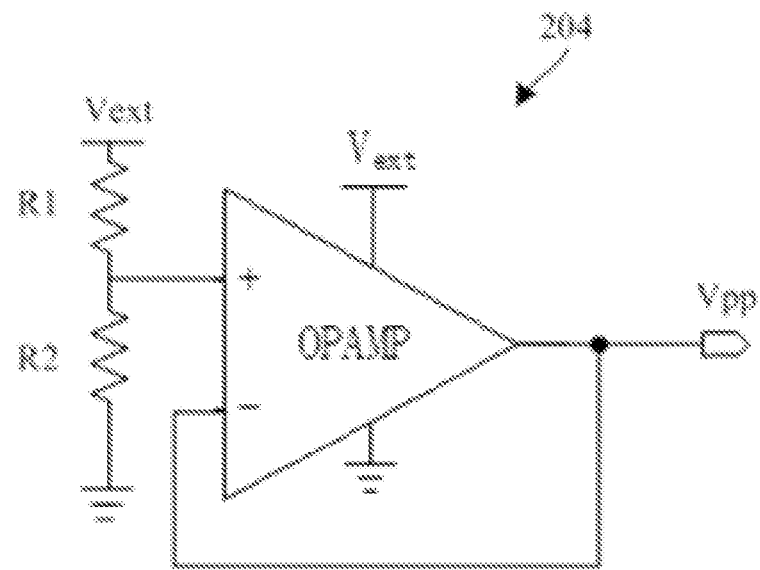
FIG. 5 is a schematic diagram illustrating a voltage regulation unit according to an embodiment of the present invention.

FIG. 5 is an electrical schematic diagram illustrating the voltage regulator 204 according to an embodiment of the present invention. In some embodiments, as shown in FIG. 5, the voltage regulation unit 204 can include an operational amplifier OPAMP, a first resistor R1, and a second resistor R2. One end of the first resistor R1 is connected or coupled to the external input first voltage Vext and the other end of the first resistor R1 is connected or coupled to one end of the second resistor R2. The other end of the second resistor R2 is connected or coupled to a ground. An electrical connection point formed between the first resistor R1 and the second resistor R2 is connected or coupled to a positive input end of the operational amplifier OPAMP. A negative input end of the operational amplifier OPAMP is connected or coupled to an output end of the operational amplifier OPAMP. A supply end of the operational amplifier OPAMP is connected or coupled to the external input first voltage, Vext. The operational amplifier OPAMP can output the second voltage, Vpp, based on the external input first voltage, Vext. Comparing with a charge pump circuit, the voltage regulation unit 204 of FIG. 5 has a simpler structure, occupies a smaller area on a memory chip, has high voltage conversion efficiency, and low power consumption.

In some embodiments, when the external input first voltage Vext ranges from 3 V to 4 V, a ratio of the resistance of the first resistor R1 to the resistance of the second resistor R2 can be configured to range between 3/2.9 to 4/2.5. In such embodiments, the second voltage Vpp outputted by the operational amplifier OPAMP is 2.9 V. In one implementation, the external input first voltage Vext can be 3.3 V. In this implementation, the ratio of the resistance of the first resistor R1 to the resistance of the second resistor R2 can be 3.3/2.9.

Figure 6:
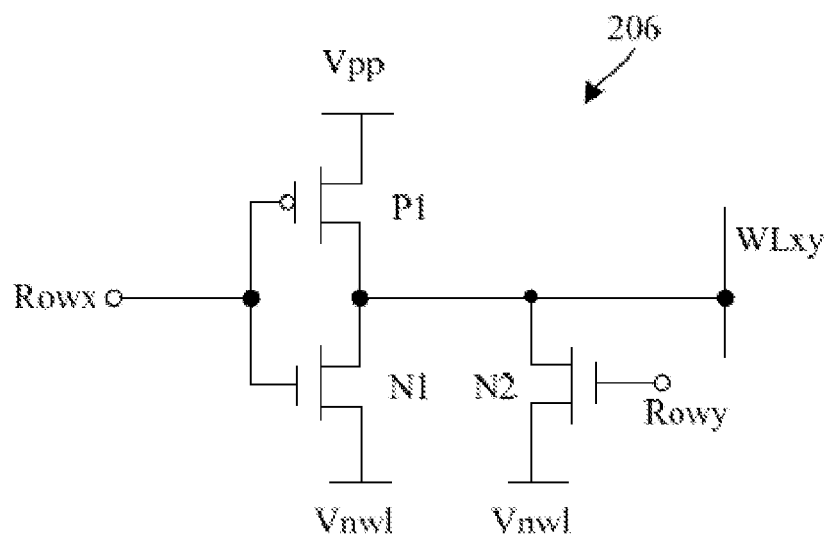
FIG. 6 is a schematic diagram illustrating a word line driver circuit according to an embodiment of the present invention.

FIG. 6 is an electrical schematic diagram illustrating the word line driver circuit 206 according to an embodiment of the present invention. In various embodiments, the second voltage Vpp outputted by the voltage regulation unit 204 can be provided to the word line driver circuit 206. In some embodiments, as shown in FIG. 6, the word line driver circuit 206 can include a first PMOS transistor P1, a first NMOS transistor N1, a second NMOS transistor N2, and a word line WLxy. The word line WLxy can be one of the plurality of word lines associated with the plurality of memory chips 201. A source of the first PMOS transistor P1 is connected or coupled to an output end of the operational amplifier OPAMP of the voltage regulation unit 204 (e.g., Vpp in FIG. 5). A drain of the first PMOS transistor P1 is connected or coupled to a drain of the first NMOS transistor N1. A gate of the first PMOS transistor P1 and a gate of the first PMOS transistor N1 are connected or coupled together and are connected or coupled to a row control circuit Rowx. A source of the first NMOS transistor N1 is connected or coupled to a well voltage Vnwl or ground. In general, the well voltage Vnwl of the word line driver circuit 206 is generally set to a negative voltage. In this way, the transistors in the plurality of the memory units can be completely turned OFF when commanded. A drain of the second NMOS transistor N2 is connected or coupled to the drain of the first PMOS transistor P1 and the drain of the first NMOS transistor N1. A gate of the second NMOS transistor N2 is connected or coupled to a row control voltage Rowy. A source of the second NMOS transistor N2 is connected or coupled to the well voltage Vnwl or ground. The drain of the first PMOS transistor P1 and the drain of the first NMOS transistor N1 are connected or coupled together and then connected or coupled to the word line WLxy. By turning ON or OFF the first PMOS transistor P1, the first NMOS transistor N1, and the second NMOS transistor N2, the second voltage Vpp may be applied to the word line WLxy. Because the word line WLxy is connected to the transistors of the plurality of storage units of the semiconductor memory (one storage unit includes a capacitor and a transistor; a gate of the transistor is connected to a word line; a drain of the transistor is connected to a bit line; and a source of the transistor is connected to the capacitor), the second voltage Vpp applied to the word line WLxy controls the transistors to be turned ON or OFF. In this way, bit lines connected or coupled to drains of the transistors can read data from capacitors coupled to the transistors (i.e., voltages stored in the capacitors) or write data to the capacitors.

Figure 7:
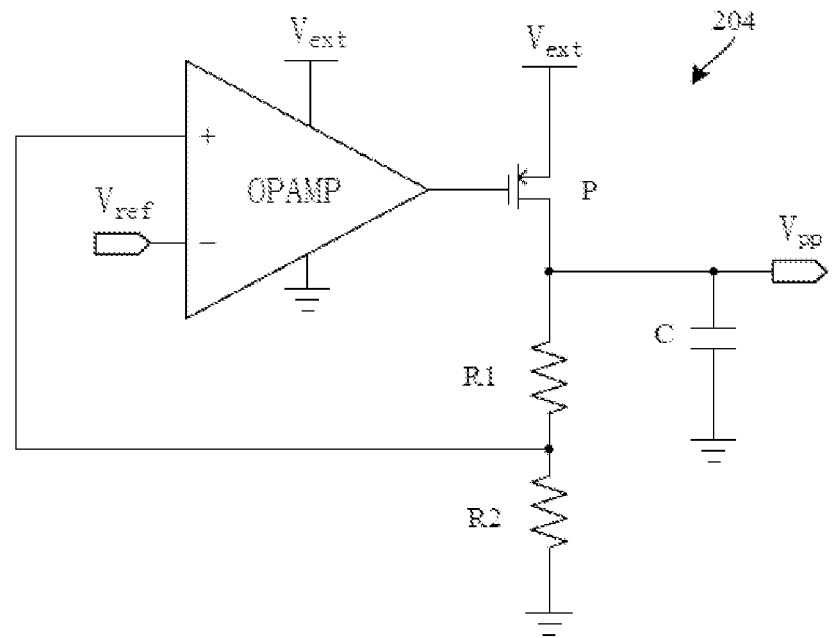
FIG. 7 is a schematic diagram illustrating a voltage regulation unit according to an embodiment of the present invention.

FIG. 7 is an electrical schematic diagram illustrating the voltage regulator 204 according to an embodiment of the present invention. In some embodiments, as shown in FIG. 7, the voltage regulation unit 204 can include an operational amplifier OPAMP, a first resistor R1, a second resistor R2, a capacitor C, and a PMOS transistor. One end of the first resistor R1 is connected or coupled to one end of the second resistor R2 and the other end of the first resistor R1 is connected or coupled to a drain of the PMOS transistor P. The other end of the second resistor R2 is connected or coupled to a ground. A positive input end of the operational amplifier OPAMP is connected or coupled to an electrical connection point formed between the first resistor R1 and the second resistor R2. A negative input end of the operational amplifier OPAMP is connected or coupled to a reference voltage Vref. An output end of the operational amplifier OPAMP is connected or coupled to a gate of the PMOS transistor P. A supply end of the operational amplifier OPAMP is connected or coupled to the external input first voltage Vext. A source N of the PMOS transistor is connected or coupled to the external input first voltage Vext. An electrical connection point formed between the drain of the PMOS transistor P and the first resistor R1 outputs the second voltage Vpp to the word line driver circuit 206. One end of the capacitor C is connected or coupled to the electrical connection point formed between the drain of the PMOS transistor P and the first resistor R1. The other end of the capacitor C is connected or coupled to the ground. Comparing with a charge pump circuit, the voltage regulation unit 204 of FIG. 7 has a simpler structure, occupies a smaller area on a memory chip, has high voltage conversion efficiency, has low power consumption, and has low output voltage noise.

In some embodiments, a ratio of the resistance of the first resistor R1 to the resistance of the second resistor R2 can be related to the reference voltage Vref. As such, the ratio may be adjusted by a person of ordinary skill in the art as required. In some embodiments, the capacitance of the capacitor C can range from 5 pF to 30 pF. In some embodiments, a bias current with which to operate the operational amplifier OPAMP can be fixed. In general, an excessively large bias current may cause large power consumption for the operational amplifier OPAMP, and a small bias current may cause a slow response for operational amplifier OPAMP which may affect output voltage stability. In some embodiments, the bias current can range from 5 µA to 50 µA. In some implementations, the bias current can have a current that corresponds to at least one of 5 µA, 10 µA, 15 µA, 20 µA, 25 µA, 30 µA, 35 µA, 40 µA, 45 µA, or 50 µA.

Figure 8:
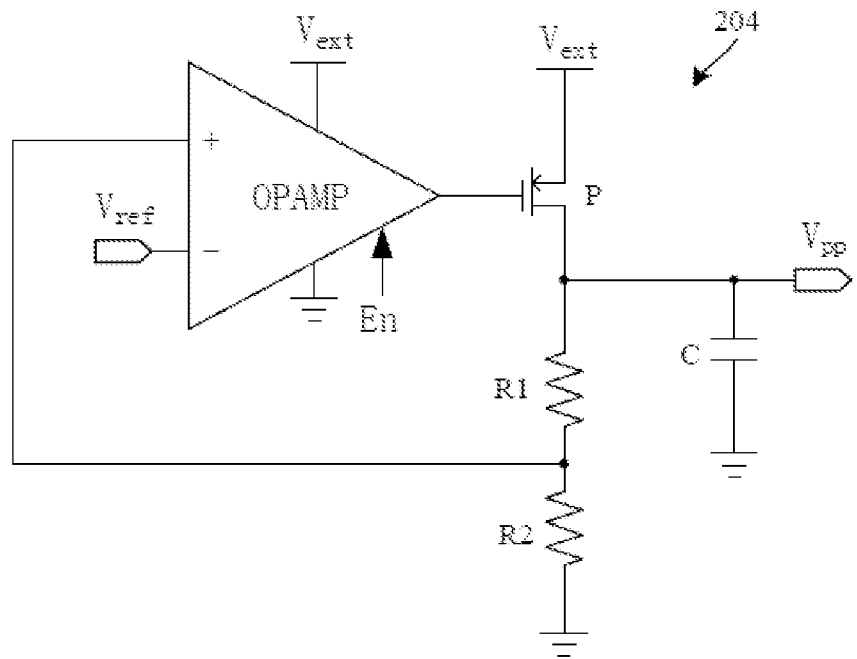
FIG. 8 is a schematic diagram illustrating a voltage regulation unit according to an embodiment of the present invention.

FIG. 8 is an electrical schematic diagram illustrating the voltage regulator 204 according to an embodiment of the present invention. In some embodiments, as shown in FIG. 8, the voltage regulation unit 204 can include an operational amplifier OPAMP, a first resistor R1, a second resistor R2, a capacitor C, and a PMOS transistor P. One end of the first resistor R1 is connected or coupled to one end of the second resistor R2 and the other end of the first resistor R1 is connected or coupled to a drain of the PMOS transistor P. The other end of the second resistor R2 is connected or coupled to a ground. A positive input end of the operational amplifier OPAMP is connected or coupled to an electrical connection point formed between the first resistor R1 and the second resistor R2. A negative input end of the operational amplifier OPAMP is connected or coupled to a reference voltage Vref. An output end of the operational amplifier OPAMP is connected or coupled to a gate of the PMOS transistor P. A supply end of the operational amplifier OPAMP is connected or coupled to the external input first voltage Vext. An enable end of the operational amplifier OPAMP is connected or coupled to an enable signal En. A source of the PMOS transistor P is connected or coupled to the external input first voltage Vext. An electrical connection point formed between the drain of the PMOS transistor P and the first resistor R1 outputs the second voltage Vpp to the word line driver circuit 206. One end of the capacitor C is connected or coupled to the electrical connection point formed between the drain of the PMOS transistor P and the first resistor R1 and the other end of the capacitor C is connected or coupled to the ground. Comparing with a charge pump circuit, the voltage regulation unit 204 of FIG. 8 has a simpler structure, occupies a smaller area on a memory chip, has high voltage conversion efficiency, and has low power consumption. In addition, the voltage regulation unit 204 of FIG. 8 can be configured to be controlled by the enable signal En to regulate the bias current of the operational amplifier OPAMP based on an operating mode of the semiconductor memory. In this way, overall power consumption of the semiconductor memory can be further reduced.

In some embodiments, the capacitance of the capacitor C can range from 5 pF to 30 pF. In some embodiments, the operational amplifier OPAMP can be configured to operate in an operating mode or sleep mode using the enable signal En. In some embodiments, a bias current of the operational amplifier OPAMP operating in the operating mode can range from 10 μA to 100 μA, which ensures voltage stability requirement for the semiconductor memory during data-read and/or data-write operations. In some embodiments, a bias current of the operational amplifier OPAMP operating in the sleep mode can range from 0.5 μA to 3 μA, which reduces power consumption of the semiconductor memory during the sleep mode.

Figure 9:
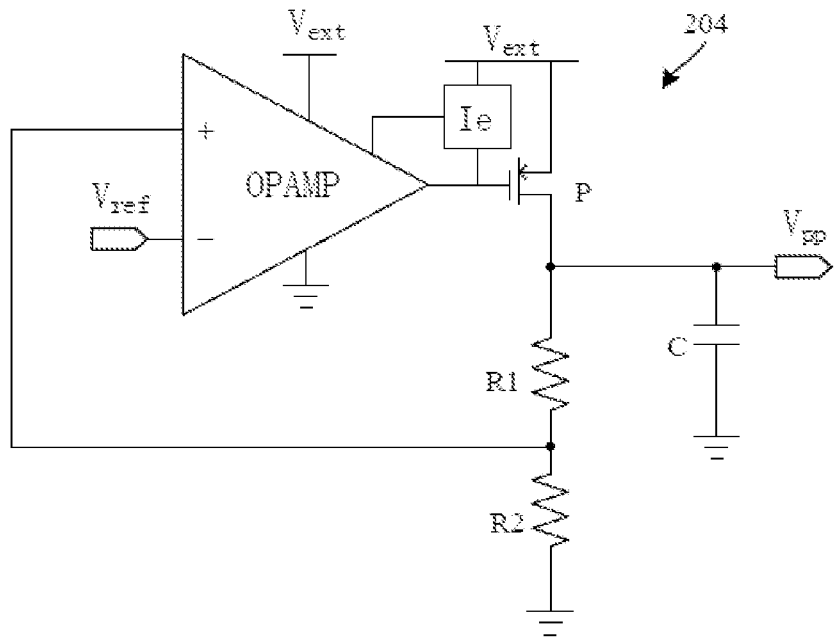
FIG. 9 is a schematic diagram illustrating a voltage regulation unit according to an embodiment of the present invention.

FIG. 9 is an electrical schematic diagram illustrating the voltage regulator 204 according to an embodiment of the present invention. In some embodiments, as shown in FIG. 9, the voltage regulation unit 204 can include an operational amplifier OPAMP, a first resistor R1, a second resistor R2, a capacitor C, a PMOS transistor P, and a mirror current source Ie. One end of the first resistor R1 is connected or coupled to one end of the second resistor R2 and the other end of the first resistor R1 is connected or coupled to a drain of the PMOS transistor P. The other end of the second resistor R2 is connected or coupled to a ground. A positive input end of the operational amplifier OPAMP is connected or coupled to an electrical connection point formed between the first resistor R1 and the second resistor R2. A negative input end of the operational amplifier OPAMP is connected or coupled to a reference voltage Vref. An output end of the operational amplifier OPAMP is connected or coupled to a gate of the PMOS transistor P. A supply end of the operational amplifier OPAMP is connected or coupled to the external input first voltage Vext. A negative voltage input end of the operational amplifier OPAMP is connected or coupled to a ground. A first input end of the mirror current source Ie is connected or coupled to the external input first voltage Vext and a second input end of the mirror current source Ie is connected or coupled to the output end of the operational amplifier OPAMP. The mirror current source Ie can be configured to generate an output current at an output end of the mirror current source Ie to regulate a bias current of the operational amplifier OPAMP. A source of the PMOS transistor P is connected or coupled to the external input first voltage Vext. An electrical connection point formed between the drain of the PMOS transistor P and the first resistor R1 outputs the second voltage Vpp to the word line driver circuit 206. One end of the capacitor C is connected or coupled to the electrical connection point formed between the drain of the PMOS transistor P and the first resistor R1 and the other end of the capacitor C is connected or coupled to the ground. Comparing with a charge pump circuit, the voltage regulation unit 204 of FIG. 9 has a simpler structure, occupies a smaller area on a memory chip, has high voltage conversion efficiency, has low power consumption, and has low output voltage noise. In addition, the mirror current source Ie can regulate a bias current of the operational amplifier OPAMP in real-time based on the output current generated by the mirror current source Ie. In this way, voltage stability of the semiconductor memory is further improved and power consumption of the semiconductor memory is further reduced.

In some embodiments, the capacitance of the capacitor C can range from 5 pF to 30 pF. In some embodiments, a ratio of the output current generated by the mirror current source Ie to a current flowing through the PMOS transistor P can range from 1:1000 to 1:100. In general, an excessively small ratio reduces voltage stability of the semiconductor memory while reducing power consumption. An excessively large ratio increases power consumption of the semiconductor memory while improving voltage stability.

Figure 10:
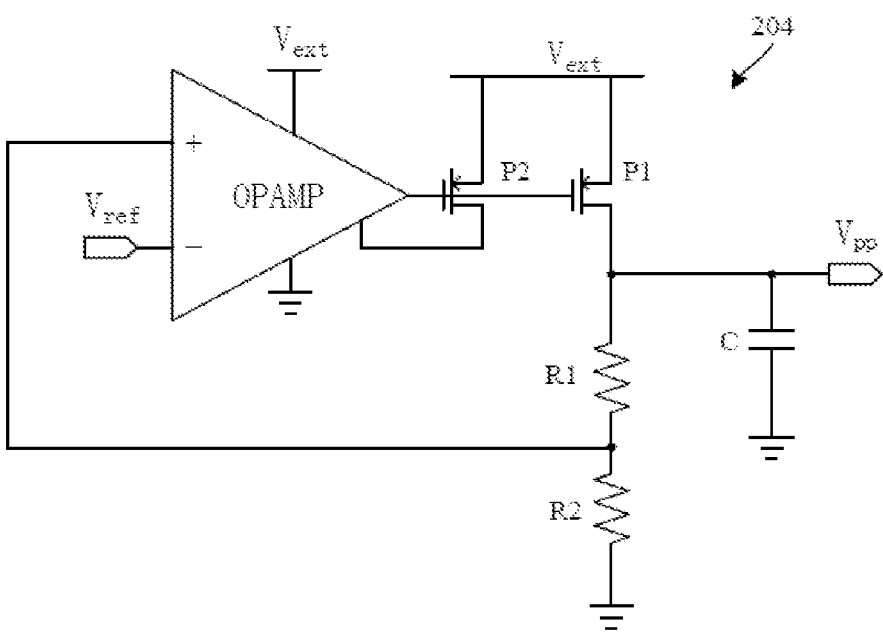
FIG. 10 is a schematic diagram illustrating a voltage regulation unit according to an embodiment of the present invention.

FIG. 10 is an electrical schematic diagram illustrating the voltage regulator 204 according to an embodiment of the present invention. In some embodiments, as shown in FIG. 10, the voltage regulation unit 204 can include an operational amplifier OPAMP, a first resistor R1, a second resistor R2, a capacitor C, a first PMOS transistor P1, and a second PMOS transistor P2. One end of the first resistor R1 is connected or coupled to one end of the second resistor R2 and the other end of the first resistor R1 is connected or coupled to a drain of the first PMOS transistor P1. The other end of the second resistor R2 is connected or coupled to a ground. A positive input end of the operational amplifier OPAMP is connected or coupled to an electrical connection point formed between the first resistor R1 and the second resistor R2. A negative input end of the operational amplifier OPAMP is connected or coupled to a reference voltage Vref. An output end of the operational amplifier OPAMP is connected or coupled to a gate of the first PMOS transistor P1. A supply end of the operational amplifier OPAMP is connected or coupled to the external input first voltage Vext. A source of the first PMOS transistor P1 is connected or coupled to the external input first voltage Vext. An electrical connection point formed between the drain of the first PMOS transistor P1 and the first resistor R1 outputs the second voltage Vpp to the word line driver circuit 206. One end of the capacitor C is connected or coupled to the electrical connection point formed between the drain of the first transistor and the first resistor R1 and the other end of the capacitor C is connected or coupled to the ground. A source of the second PMOS transistor P2 is connected or coupled to the external input first voltage Vext. A gate of the second PMOS transistor P2 is connected or coupled to the output end of the operational amplifier OPAMP and a drain of the second PMOS transistor P2 is connected or coupled to a bias current regulation end of the operational amplifier OPAMP to regulate a bias current of the operational amplifier. Comparing with a charge pump circuit, the voltage regulation unit 204 of FIG. 10 has a simpler structure, occupies a smaller area on a memory chip, has high voltage conversion efficiency, has low power consumption, and has low output voltage noise. In addition, configuring the PMOS transistor P2 as a mirror current source simplifies circuit structure and, therefore, can reduce an area occupied by the voltage regulation unit 204 on the memory chip.

In some embodiments, the capacitance of the capacitance C can range from 5 pF to 30 pF.

Preferred embodiments have been disclosed above in the present invention, but are not intended to limit the present invention. Any person skilled in the art can make possible changes and modifications to the technical solutions of the present invention by using the disclosed methods and technical content without departing from the spirit and scope of the present invention. Therefore, any simple modification, equivalent change, and polishing made to the foregoing embodiments according to the technical essence of the present invention without departing from the content of the technical solutions of the present invention shall fall within the protection scope of the technical solutions of the present invention.

What is claimed is:

1. A semiconductor memory comprising:
a memory chip comprising at least a storage array; and
a voltage regulation unit comprising at least an operational amplifier, wherein the voltage regulation unit is configured to convert an external input first voltage into a second voltage to be provided to a word line driver circuit associated with the memory chip, wherein the external input first voltage is greater than the second voltage, wherein the voltage regulation unit is an independent voltage regulation chip, and wherein the semiconductor memory further comprises a line substrate, wherein the line substrate includes a connection line and the memory chip and the voltage regulation chip are disposed on the line substrate, wherein the voltage regulation chip is connected to the memory chip through the connection line, and wherein the second voltage outputted by the voltage regulation chip is provided to the word line driver circuit associated with the memory chip through the connection line of the line substrate.

2. The semiconductor memory of claim 1, further comprising:
a second memory chip, wherein the memory chip and the second memory chip are sequentially vertically stacked or horizontally arranged in a plane.

3. The semiconductor memory of claim 2, wherein the voltage regulation unit outputs the second voltage to the word line driver circuit associated with the memory chip or a word line driver circuit associated with the second memory chip.

4. The semiconductor memory of claim 3, wherein the voltage regulation unit is integrated into at least one of the memory chip or the second memory chip.

5. The semiconductor memory of claim 2, further comprising:
a second voltage regulation unit, wherein the second voltage regulation unit is configured to convert the external input first voltage into the second voltage to be provided to a word line driver circuit associated with the second memory chip.

6. The semiconductor memory of claim 5, wherein the voltage regulation unit and the second voltage regulation unit are configured to simultaneously provide the second voltage to at least one of the word line driver circuit associated with the memory chip or the word line driver circuit associated with the second memory chip.

7. The semiconductor memory of claim 5, wherein the voltage regulation unit is integrated into the memory chip and the second voltage regulation unit is integrated into the second memory chip.

8. The semiconductor memory of claim 1, wherein the memory chip is a dynamic random access memory (DRAM) chip.

9. The semiconductor memory of claim 8, wherein the external input first voltage ranges from 3 V to 4 V and the second voltage ranges from 2.5 V to 2.9 V.

10. The semiconductor memory of claim 1, wherein the voltage regulation unit comprises a first resistor, a second resistor, and a PMOS transistor, wherein:
one end of the first resistor is coupled to one end of the second resistor and the other end of the first resistor is connected to a drain of the PMOS transistor;
the other end of the second resistor is coupled to a ground;
a positive input end of the operational amplifier is coupled to an electrical connection point formed between the first resistor and the second resistor;
a negative input end of the operational amplifier is coupled to a reference voltage;
an output end of the operational amplifier is coupled to a gate of the PMOS transistor;
a supply end of the operational amplifier is coupled to the external input first voltage;
an enable end of the operational amplifier is coupled to an enable signal;
a source of the PMOS transistor is coupled to the external input first voltage; and
an electrical connection point formed between the drain of the PMOS transistor and the first resistor outputs the second voltage.

11. The semiconductor memory of claim 10, wherein the voltage regulation unit further comprises a capacitor, wherein:
one end of the capacitor is coupled to the electrical connection point formed between the drain of the PMOS transistor and the first resistor;
the other end of the capacitor is coupled to the ground;
a capacitance of the capacitor ranges from 5 pF to 30 pF;
the operational amplifier is controlled to operate in at least one of an operating mode or sleep mode through an enable signal;
a bias current of the operational amplifier in the operating mode ranges from 10 µA to 100 µA; and
a bias current of the operational amplifier in the sleep mode ranges from 0.5 µA to 3 µA.

12. The semiconductor memory of claim 1, wherein the voltage regulation unit comprises a first resistor, a second resistor, a PMOS transistor, and a mirror current source, wherein:
one end of the first resistor is coupled to one end of the second resistor and the other end of the first resistor is coupled to a drain of the PMOS transistor;
the other end of the second resistor is coupled to a ground;
a positive input end of the operational amplifier is coupled to an electrical connection point formed between the first resistor and the second resistor;
a negative input end of the operational amplifier is coupled to a reference voltage;
an output end of the operational amplifier is coupled to a gate of the PMOS transistor;
a supply end of the operational amplifier is coupled to the external input first voltage;
a first input end of the image current source is coupled to the external input first voltage;
a second input end of the mirror current source is coupled to the output end of the operational amplifier;
an output end of the mirror current source generates an output current to regulate a bias current of the operational amplifier;
a source of the PMOS transistor is coupled to the external input first voltage and
an electrical connection point formed between the drain of the PMOS transistor and the first resistor outputs the second voltage.

13. The semiconductor memory of claim 12, wherein the voltage regulation unit further comprises a capacitor, wherein:
one end of the capacitor is coupled to the electrical connection point between the drain of the PMOS transistor end the first resistor;
the other end of the capacitor is coupled to the ground;
a capacitance of the capacitor ranges from 5 pF to 30 pF; and a ratio of the output current of the mirror current source to a current through the PMOS transistor ranges from 1:1000 to 1:100.

14. The semiconductor memory of claim 1, wherein the voltage regulation unit comprises a first resistor, a second resistor, a first PMOS transistor, and a second PMOS transistor, wherein:
one end of the first resistor is coupled to one end of the second resistor and the other end of the first resistor is coupled to a drain of the first PMOS transistor;
the other end of the second resistor is coupled to a ground;
a positive input end of the operational amplifier is coupled to an electrical connection point between the first resistor and the second resistor;
a negative input end of the operational amplifier is coupled to a reference voltage;
an output end of the operational amplifier is coupled to a gate of the first PMOS transistor;
a supply end of the operational amplifier is coupled to the external input first voltage;
a source of the first PMOS transistor is coupled to the external input first voltage;
an electrical connection point formed between the drain of the first PMOS transistor and the first resistor outputs the second voltage;
a source of the second PMOS transistor is coupled to the external input first voltage;
a gate of the second PMOS transistor is coupled to the output end of the operational amplifier; and
a drain of the second PMOS transistor is coupled to a bias current regulation end of the operational amplifier to regulate a bias current of the operational amplifier.

15. The semiconductor memory of claim 14, wherein the voltage regulation unit further comprises a capacitor, wherein:
one end of the capacitor is coupled to the electrical connection point formed between the drain of the first transistor and the first resistor;
the other end of the capacitor is coupled to the ground; and
a capacitance of the capacitor ranges from 5 pF to 30 pF.

16. A semiconductor memory comprising:
a memory chip comprising at least a storage array; and
a voltage regulation unit comprising at least an operational amplifier, wherein the voltage regulation unit is configured to convert an external input first voltage into a second voltage to be provided to a word line driver circuit associated with the memory chip, wherein the external input first voltage is greater than the second voltage, wherein the voltage regulation unit further comprises a first resistor and a second resistor, wherein:
one end of the first resistor is coupled to the external input first voltage and the other end of the first resistor is coupled to one end of the second resistor;
the other end of the second resistor is coupled to a ground;
an electrical connection point formed between the first resistor and the second resistor is coupled to a positive input end of the operational amplifier;
a negative input end of the operational amplifier is coupled to an output end of the operational amplifier and outputs the second voltage; and
a supply end of the operational amplifier is coupled to the external input first voltage.

17. The semiconductor memory of claim 16, wherein a ratio of a resistance of the first resistor to a resistance of the second resistor ranges from 3/2.9 to 4/2.5.

18. A semiconductor memory comprising:
a memory chip comprising at least a storage array; and
a voltage regulation unit comprising at least an operational amplifier, wherein the voltage regulation unit is configured to convert an external input first voltage into a second voltage to be provided to a word line driver circuit associated with the memory chip, wherein the external input first voltage is greater than the second voltage, wherein the voltage regulation unit comprises a first resistor, a second resistor, and a p-channel metal oxide semiconductor (PMOS) transistor, wherein:
one end of the first resistor is coupled to one end of the second resistor and the other end of the first resistor 1s coupled to a drain of the PMOS transistor;
the other end of the second resistor is coupled to a ground;
a positive input end of the operational amplifier is coupled to an electrical connection point formed between the first resistor and the second resistor;
a negative input end of the operational amplifier is coupled to a reference voltage;
an output end of the operational amplifier is coupled to a gate of the PMOS transistor;
a supply end of the operational amplifier is coupled to the external input first voltage;
a source of the PMOS transistor is coupled to the external input first voltage; and
an electrical connection point formed between the drain of the PMOS transistor and the first resistor outputs the second voltage.

19. The semiconductor memory of claim 18, wherein the voltage regulation unit further comprises a capacitor, wherein:
one end of the capacitor is coupled to the electrical connection point formed between the drain of the PMOS transistor and the first resistor;
the other end of the capacitor is coupled to the ground;
a capacitance of the capacitor ranges from 5 pF to 30 pF; and
a bias current of the operational amplifier ranges from 5 µA to 50 µA.

* * * * *